United States Patent [19]

Neal et al.

[11] 4,281,397

[45] Jul. 28, 1981

[54] VIRTUAL GROUND MOS EPROM OR ROM MATRIX

[75] Inventors: Joseph H. Neal, Missouri City; Paul A. Reed, Houston, both of Tex.

[73] Assignee: Texas Instruments Incorporated, Dallas, Tex.

[21] Appl. No.: 88,789

[22] Filed: Oct. 29, 1979

[51] Int. Cl.³ ............................................. G11C 11/40
[52] U.S. Cl. ................................... 365/189; 365/230; 307/238.3
[58] Field of Search ............... 365/189, 191, 227, 230, 365/233, 239; 307/238

[56] References Cited

U.S. PATENT DOCUMENTS 4,174,541  11/1979  Schmitz ................................ 365/227

Primary Examiner—Terrell W. Fears
Attorney, Agent, or Firm—John G. Graham

[57] ABSTRACT

An array of rows and columns of memory cells of the virtual ground type employs a cell layout which has one column line per column instead of requiring extra lines for ground. Half of the column lines are used as outputs and half as ground. One output line and one ground line are selected by improved decode circuitry. The cell array is of a continuous web type wherein metal-to-silicon contacts are shared by four adjacent cells.

9 Claims, 19 Drawing Figures

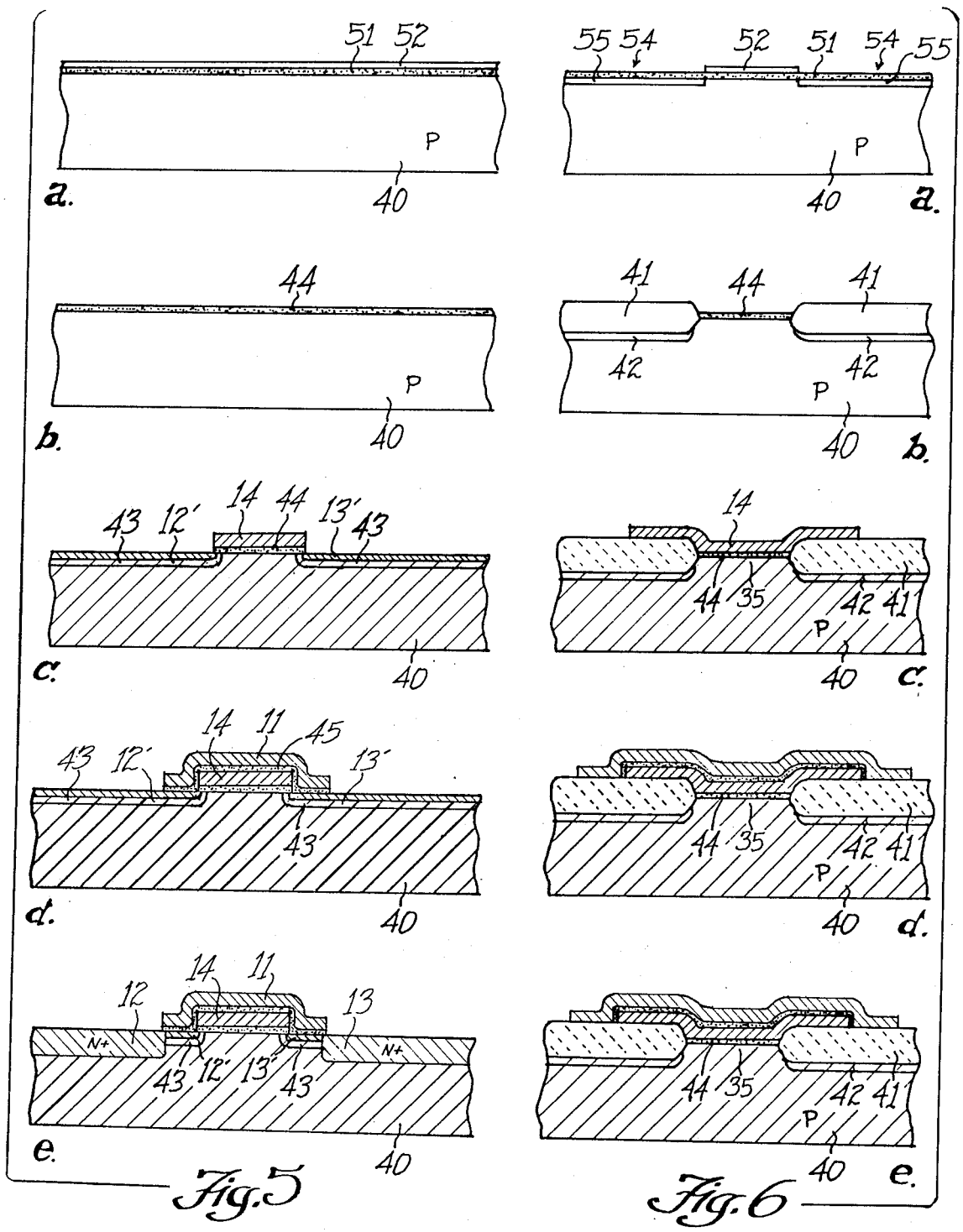

VIRTUAL GROUND MOS EPROM OR ROM MATRIX

BACKGROUND OF THE INVENTION

This invention relates to semiconductor memory devices, and more particularly to MOS read-only type memories of the virtual ground type.

Floating gate type electrically programmable ROM devices have been thus far manufactured using cell layouts as seen in U.S. Pat. Nos. 4,112,509 and 4,112,544, issued to Wall and McElroy, assigned to Texas Instruments. Several manufacturers produce EPROM devices of these or similar layouts in 8K, 16K, 32K and recently 64K bit sizes. The continuing demand for higher speed and lower cost, however, requires reduction in cell size or increase in bit density. One of the classic techniques for increasing the array density in read-only type memories (ROMs or EPROMs) is to use virtual grounds instead of providing a ground line for each column or output line. Virtual ground ROMs are disclosed in U.S. Pat. No. 3,934,233 issued to Fisher and Rogers or U.S. Pat. No. 4,021,781 issued to E. R. Caudel, both assigned to Texas instruments. The currents and high voltages required in programming of floating gate EPROMs place more stringent demands on the decode circuitry previously employed in virtual ground devices. This is the reason that prior EPROM layouts used separate contacts and lines to each cell, which unfortunately uses excess space on the chip.

It is the principal object of this invention to provide an improved EPROM or ROM device, which is of smaller size or greater bit density. Another object is to provide improved decode circuitry for "virtual ground" type memory devices. A further object is to provide an arrangement for accessing a memory array for read and/or programming in an improved manner.

SUMMARY OF THE INVENTION

In accordance with one embodiment of the invention, an array of rows and columns of memory cells of the virtual ground type employs a cell layout which has one column line per column instead of requiring extra lines for ground. One input line and one ground line are selected by improved decode circuitry. The cell array is of a continuous web type wherein metal-to-silicon contacts are shared by four adjacent cells.

This cell array and decode can be used advantageously in a ROM device as well as in EPROMs.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 5A–5E and 6A–6E are elevation views in section of the cell array of FIGS. 3 and 4A–4D, at successive stages in the manufacturing process, taken generally along the lines A—A and C—C in FIG. 3.

DETAILED DESCRIPTION OF SPECIFIC EMBODIMENT

Figure 1:
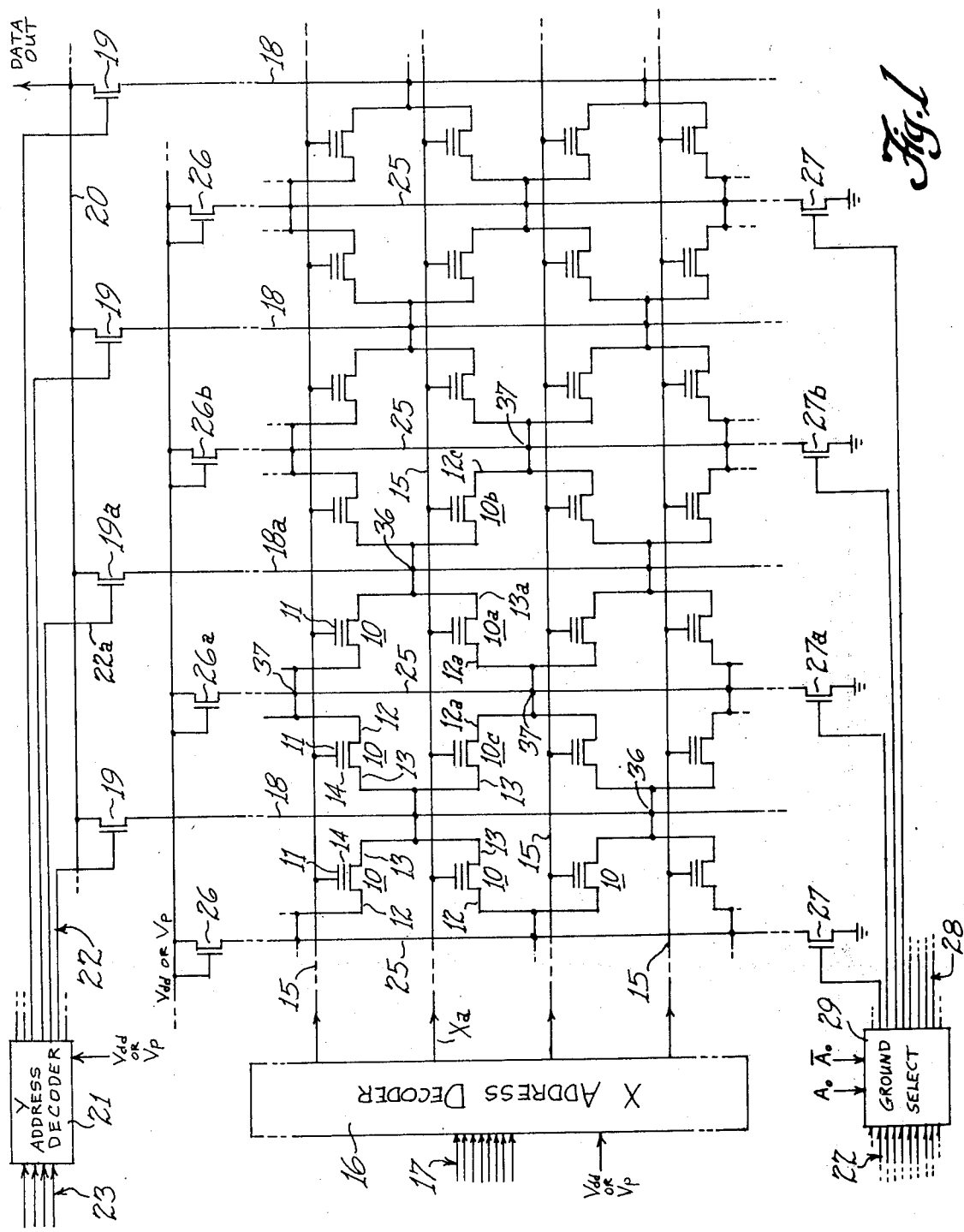
FIG. 1 is an electrical schematic diagram of a cell array and decode circuit according to the invention.

Referring to FIG. 1, a memory device is shown which has an array of rows and columns of memory cells 10, each of which is an insulated gate field effect transistor having a control gate 11, a source 12 and a drain 13. The cells may be of the read-only or ROM type, or may be of the electrically programmable or EPROM type. In the latter case, each cell would have a floating gate 14 between the control gate 11 and the channel between source and drain.

The control gates 11 of all cells in each row are connected to one of a set of row lines or X lines 15. In a 256×256 array containing 65,768 cells, for example, there would be 256 of the lines 15 connected to an X decoder 16 which selects 1-of-256 based on an 8-bit X or row address on lines 17. In a read operation, the selected one of the lines 15 goes high, the others remain low.

The drains 13 of adjacent cells 10 are connected in common to Y output lines 18; in the 256×256 cell array example there are 128 lines 18 which are ordinarly partitioned to produce an 8-bit parallel output from the device so there would be eight groups of thirty-two cells per group and each group would contain sixteen of the lines 18. The lines 18 are connected through Y output select transistors 19 to a Y output line 20 (there would be eight separate lines 20, one for each group of thirty-two cells 10). The gates of the transistors 19 are connected to a Y decoder 21 via lines 22 which function to apply a logic 1 voltage to one of the lines 22 and hold the others at Vss. In this example, the decoder 21 is a one-of-16 decoder of standard construction, needing a 4-bit address input on lines 23. A 5-bit address is needed to select one-of-32 cells in a group, so only the four MSB bits $A_1$–$A_4$ of a 5-bit Y address $A_0$–$A_4$ are needed. The LSB address bit $A_0$ is only used in the ground side. The one-of-16 decoder 21 and the lines 22 are shared by all eight groups on the Y output side; these need not be duplicated for each group.

The sources 12 of adjacent cells 10 are connected in common to another set of column lines 25 which function as ground lines. In each group of 32 cells 10 seventeen lines 25 are needed. That is, for an M×N array the number of ground lines is (N/2)+1. Each line 25 is connected through a load device 26 to Vdd, and is also connected through a column select transistor 27 to ground or Vss. The gates of all of these transistors 27 are connected via lines 28 to a selector 29 which receives the output lines 22 from the Y decode 21, along with the LSB address bit $A_0$ and its complement $\overline{A_0}$, and functions to activate only one of the lines 28 for a given Y address.

Figure 2:
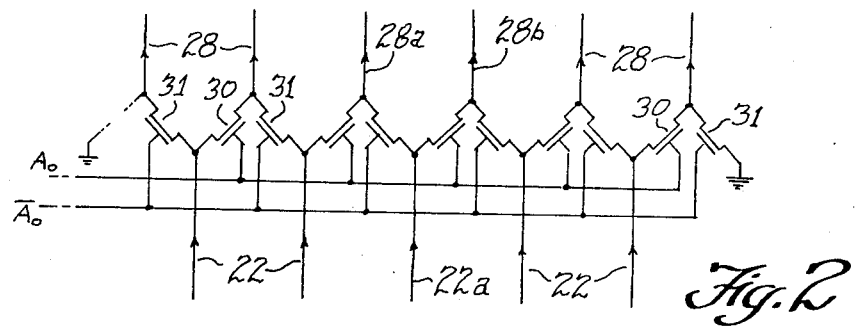
FIG. 2 is an electrical schematic diagram of part of the decode circuit used in the memory device of FIG. 1.

A schematic diagram of the select circuit 29 is seen in FIG. 2, where the Y decode outputs 22 are shown to generate the one-of-17 selection on the lines 28 by using transistors 30 having gates connected to $\overline{A_0}$ and transistors 31 having gates connected to $\overline{A_0}$. For example, if line 22a is high, then line 28a will go high if $\overline{A_o}$ is 1 or line 28b will go high if Ao is 1, turning on either transistor 27a or 27b, respectively. This results in selection of cell 10a or 10b, either of which connects to output via line 18a through transistor 19a (turned on by line 22a).

The decode circuitry and the cell matrix must meet certain requirements for proper operation. Programming of a cell requires a voltage Vp of +15 to +25 on the drain 13 and a source-to-drain current of from 0.5 to 3.0 ma. Reading the EPROM matrix cell requires detecting of currents in the 15 to 60 microamp range.

In the preceding example, for a read operation, Xa (one of the row address lines 15) is high, at +5 V, and transistors 19a and 27a are on. All of the other transistors are off. The transistor 27a must be large enough to pull down the load device 26a, conduct to ground any current through transistors 10a and 10c and maintain a very low level of approximately 0.2 to 0.3 volts on the node 12a. The load 26b is needed to charge up the node 12c to a point that the cell 10b is turned off. This eliminates the need for the sense amplifier connected to the output line 20 to charge the capacitance of the node 12c and beyond. The cell 10b will turn off with a low voltage on the node 12c due to the large body effect of the transistors 10. The body effect is large due to the P+ tank used in making these transistors, or the P region in the channel.

To write into or program the cell 10a, the same transistors are turned on or off as for a read operation, but this time the on transistors have a large positive voltage Vp on their gates. The transistor 27a must be large enough to hold the node 12a at approximately 0.3 volts and have 1 to 3 ma passing through. The transistor 19a will have a large voltage +Vp on its drain causing a large voltage on the node 13a. The load 26b again charges the node 12c, this time so that the cell 10c does not program. A voltage of +3 V or more on the node 12c will prohibit the cell 10c from programming.

Figure 3:
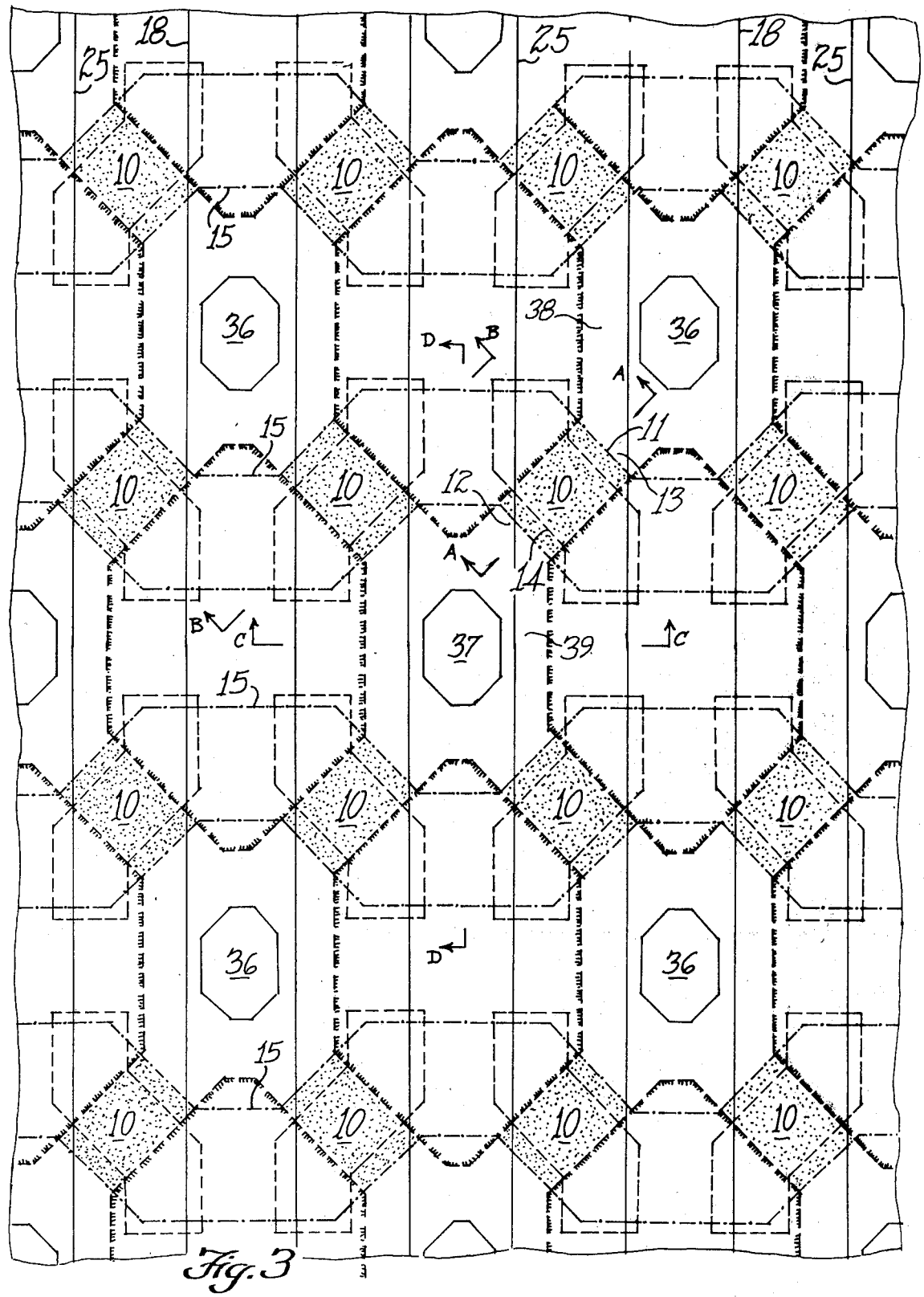
FIG. 3 is a greatly enlarged plan view of a small portion of a semiconductor chip showing the physical layout of a part of a cell array made according to the invention.

A small part of the cell array is shown in FIG. 3 which includes sixteen of the cells 10, four of the X address lines 15, and five metal strips which form the Y output lines 18 or ground lines 25. As seen in FIG. 3 and the sectional views of FIGS. 4A–4D, the source and drain regions 12 and 13 are formed by N+ diffused regions in a continuous web of "moat" area which also includes channel regions 35 between each source and drain and contact areas 36 and 37 for metal-to-moat contacts. The metal output lines 18 contact the common N+ regions 38 of moat at contact areas 36 while the metal ground lines 25 contact common N+ regions 39 of the moat at areas 37. Each of the common regions 38 or 39 forms the sources or drains, respectively, of four of the transistors 10. The cell array is formed in a face of a silicon bar 40 and a thick field oxide 41 covers all of this face except for the moat areas. P+ channel stop regions 42 underlie all field oxide in the usual manner. Shallow N+ arsenic-implanted regions 12' and 13' act as extensions of the source and drain regions 12 and 13 where the control gates overlap the floating gates, and P regions 43 formed by faster diffusing boron produces the programming efficiency advantages which were produced by the conventional P+ tank. A thin layer of gate oxide 44 insulates the floating gate from the channel 35, and a thin oxide layer 45 insulates the floating gate from the control gate 11. A thick layer of deposited interlevel oxide 46 separates the second level polysilicon which forms the X lines 15 and control gates 11 from the metal lines 18 and 25.

The EPROM cells 10 are programmed by applying a high voltage Vp, about +25 V, between a drain 13 and source 12 while holding the control gate of a selected cell at Vp. High current through the cell causes tunnelling of electrons through the gate oxide 44 to charge the floating gate 14. This functions to increase the threshold voltage of the cell to above Vdd (usually +5 V). The charge on the floating gate will remain indefinitely. Erase is accomplished by exposing the device to ultraviolet light which discharges the floating gates.

Turning now to FIGS. 5A–5E and 6A–6E, a process for manufacturing the devices described above will be explained. Note that FIGS. 5A–5E correspond to the sectional view of FIG. 4A in the finished device, that is to line A—A in FIG. 3, while FIGS. 6A–6E correspond to the sectional view of FIG. 4B, that is to the line B—B in FIG. 3.

This is basically an N-channel, silicon-gate, self-aligned, double level poly process for making MOS integrated circuit devices as set forth in copending application Ser. No. 72,504 filed Sept. 4, 1979, by Chiu and Lien, assigned to Texas Instruments. The starting material is a slice of P-type monocrystalline silicon, perhaps 4 inches in diameter and 20 mils thick, cut on the <100> plane. The slice is P-type, doped with boron in growing to a resistivity of about 12 to 15 ohm-cm. In the FIGURES, the parts of the wafer or body 40 represent very small parts of the slice, chosen as representative sample cross sections. After appropriate cleaning the slice is oxidized by exposing to oxygen in a furnace at an elevated temperature of perhaps 1000° C. to produce an oxide layer 51 of a thickness of about 1000 Å. A layer 52 of silicon nitride $Si_3N_4$ of about 1000 Å is formed by exposing to an atmosphere of dichlorosilane and ammonia in a reactor. A coating of photoresist is applied to the entire top surface, then exposed to ultraviolet light through a mask which defines the desired pattern, and developed. This leaves areas 54 where nitride is to be etched away; these are the areas where the field oxide 41 is to be grown. The slice is subjected to a plasma etch, which removes the part of the nitride layer 52 not covered by the photoresist, but does not remove the oxide layer 51 and does not react with the photoresist.

The slice is now subjected to a boron implant into the areas 54 not covered by photoresist. Photoresist masks the implant. A more heavily doped P+ region 55 is thus produced in the surface. The photoresist is then removed.

As set forth in U.S. Pat. No. 4,055,444 issued to G. R. Mohan Rao, assigned to Texas Instruments, the slice is next subjected to a heat treatment at about 1000° C. for perhaps about two hours in an inert atmosphere such as nitrogen, causing the P+ regions 55 to penetrate deeper into the silicon surface and curing implant damage.

The next step is formation of field oxide 41, which is done by subjecting the slices to steam or an oxidizing atmosphere at about 900° C. for perhaps 10 hours. As seen in FIG. 6B, this causes a thick field oxide layer 41 to be grown, and this region extends into the silicon surface because silicon is consumed as it oxidizes. The nitride layer 52 masks oxidation beneath it. The thickness of this layer 41 is about 10,000 Å, part of which is above the original silicon surface and part below. The boron doped P+ region 55 as previously implanted and modified by the $N_2$ anneal step will be partly consumed, but will also diffuse further into the silicon ahead of the oxidation front, producing the P+ channel stop regions 42.

The nitride layer 52 and its underlying oxide layer 51 are now removed by etching and another thin silicon oxide layer 44 of about 800 Å is grown over the exposed areas of silicon, producing the gate insulator. At this time, although not reflected in the FIGURES, ion implant steps may be performed to create the desired threshold voltages in transistors in the peripheral circuits. Windows for first level polysilicon to substrate contacts (none seen in these views) are patterned and etched using photoresist, removing the gate oxide layer 44 in selected areas.

A layer of polycrystalline silicon of about one-half to one micron thickness is deposited over the entire slice in a reactor using standard techniques, producing the polysilicon which will ultimately form the floating gates 14. The layer of poly is subjected to a phosphorus deposition and diffusion to render it highly conductive. This diffusion does not penetrate the substrate 40 except at the poly to silicon contact areas (not shown).

Referring to FIGS. 5C and 6C, the polysilicon layer and the underlying gate oxide 44 are next patterned by applying a layer 56 of photoresist, exposing to ultraviolet light through a mask, developing the photoresist image, and then etching, with the remaining photoresist 56 masking certain areas of the polysilicon. The remaining part of the polysilicon layer provides what will be the floating gate 14 of one of the transistors 10.

The slice is next subjected to a blanket arsenic implant at about $10^{13}$ to $10^{14}$ per cm$^2$ which will create the implanted N regions 12' and 13'. Then, a boron implant at about $5\times10^{12}$ to $5\times10^{14}$ per cm$^2$ is performed to create the P-type regions 43. Another photoresist mask step covers areas where these implants are not wanted, if necessary. These two implants are both aligned with the first level poly gate 14 and underlying oxide 44. Boron will diffuse much faster than arsenic in a subsequent high temperature drive-in. The amount of drive-in is selected so that the boron doped regions 43 will have high enough boron doping to assist in hot electron injection into oxide, but the boron doped region is narrow enough to be punched through by the reverse biased voltage applied across the N+ to P junction.

The layer 45 of silicon dioxide is next grown on the first level polysilicon, producing a coating on all exposed surfaces of the poly, as seen in FIG. 5D, including tops and sides. If second level poly to silicon contacts are needed in the peripheral circuitry, contact areas would be opened at this point; none are used in the cell array.

The second level polysilicon is next deposited over the entire top surface of the slice, covering the oxide layer 45. The second layer poly is patterned using photoresist to define the control gates 11 and the row address strips 15, then oxide layer 45 is etched away in all areas except under the strips 15. A deposition and diffusion operation into the moats produces the heavily doped N+ source and drain regions 12 and 13 as well as the N+ regions 38 and 39 under the contact areas 36 and 37. The N+ diffused moat regions function as conductors which connect the various regions together, and also function as the source or drain regions. This diffusion also heavily dopes all the exposed polysilicon areas such as the control gates 11 and lines 15.

Figure 4:
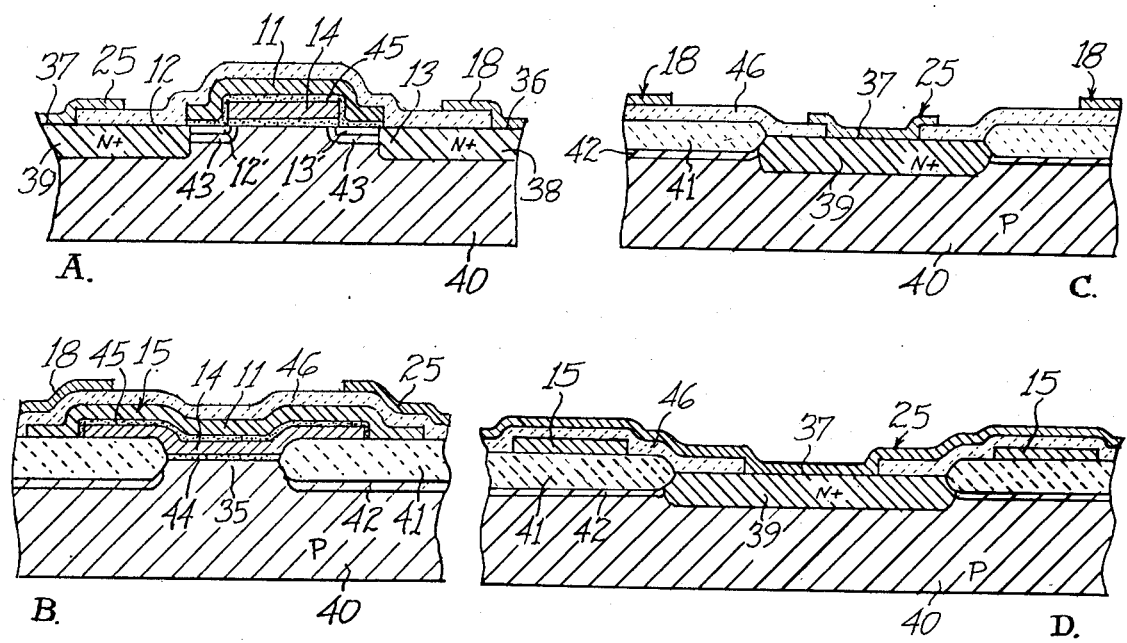
FIGS. 4A–4D are elevation views in section of the cells of FIG. 3, taken along the lines A—A, B—B, C—C, and D—D, respectively.

As seen in FIGS. 4A and 4B, fabrication of the device is continued by depositing a layer 46 of about 6000 Å of phosphorus-doped oxide by a low temperature reaction process using conventional chemical vapor deposition techniques. A photoresist operation opens windows in the oxide layer 46 in areas 36 and 37 where contact is to be made from metal to the N+ moat regions 38 and 39 (or from metal to a polysilicon layer, none seen in the illustrative embodiment). A "densification" step may be used wherein the slice is heated at 1000° C. for the purpose of eliminating minute holes or pores in the oxide and smoothing out steps at contact locations. Then a layer of aluminum is deposited on the entire slice and patterned using photoresist masking to provide the metal lines 18 and 25, and various peripheral interconnections. A protective overcoat is deposited and patterned to expose bonding pads, the slice is scribed and broken into individual bars, and the bars packaged in the customary manner.

Figure 7:
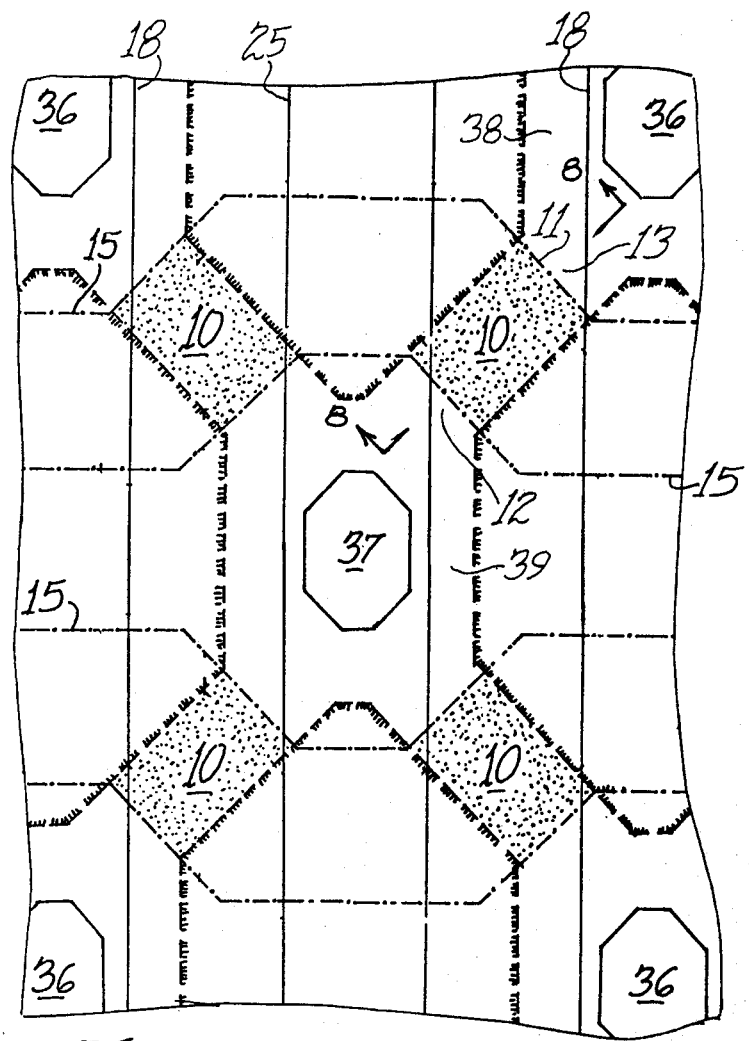
FIGS. 7 and 8 are plan and elevation views of another embodiment, corresponding to FIGS. 3 and 4A.
Figure 8:
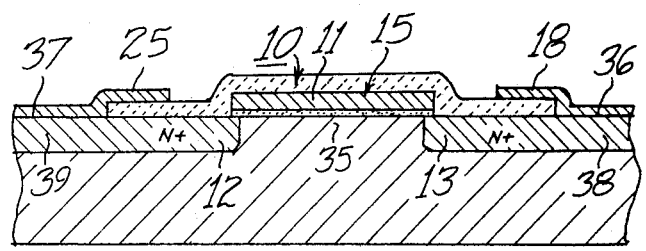

The cell array and decode arrangement discussed above may be used in a ROM device instead of an EPROM device. FIG. 7 shows a ROM array, which is the same as corresponding EPROM array of FIG. 3 except that no floating gate 14 is included and a single-level poly process is used instead of double level poly. The cells may be programmed by implant through the poly gates as set forth in patent applications Ser. Nos. 890,555 or 890,557, filed Mar. 20, 1978, by C-K Kuo, or programmed by the moat mask as set forth in patent application Ser. No. 914,644 filed June 12, 1978, by David J. McElroy, said applications assigned to Texas Instruments. As seen in the section view of FIG. 8, the N and P implants 12', 13' and 43 are not needed since there is no floating gate and no programming efficiency problems. The array of FIGS. 7 and 8 would be connected in a circuit corresponding to FIG. 1, with no programming voltage $V_p$ input.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A semiconductor memory device comprising an array of rows and columns of memory cells in a face of a semiconductor body, each cell including a transistor having a control electrode and a current path between first and second electrodes, a plurality of row lines, the control electrodes of all transistors in a row being electrically connected to a row line, a plurality of column lines, alternate first and second column lines adjacent one another functioning as ground lines and output lines, respectively, all of the first electrodes of adjacent transistors in adjacent columns of cells being connected to a first column line functioning as a ground line, all of the second electrodes of adjacent transistors in adjacent columns of cells being connected to a second column line functioning as an output line, row decode means for selecting row lines for accessing the array, and column decode means for selecting first column lines and selecting second column line for accessing the array.

2. A device according to claim 1 wherein the column decode means receives and addresses input and selects only one of said first column lines and only one of said second column lines for a given address input.

3. A device according to claim 1 wherein said transistors are insulated gate field effect transistors, the first electrodes are source regions and the second electrodes are drain regions.

4. A device according to claim 3 wherein said transistors are floating gate type electrically programmable read only memory devices each having a floating gate beneath the control electrode.

5. A device according to claim 4 wherein the row decode means and column decode means include means for selectively applying high voltage to said drain regions and control electrodes for programming.

6. A device according to claim 3 wherein the column decode means includes a first set of transistors each having a source-to-drain path in series with one of the first column lines and includes a second set of transistors each having a source-to-drain path in series with one of the second column lines.

7. A device according to claim 6 wherein a load device separately connects each of said first column lines to a supply voltage.

8. A device according to claim 7 wherein a multi-bit column address selects one of the first sets of transistors and one of the second transistors.

9. A device according to claim 8 wherein the column decode means is non-responsive to the least significant bit of said multi-bit address in selecting said one of the second transistors.

* * * * *